(12) United States Patent
Ye et al.

(10) Patent No.: US 11,068,100 B1
(45) Date of Patent: Jul. 20, 2021

(54) ELECTRONIC APPARATUS

(71) Applicant: TPK Touch Solutions (Xiamen) Inc., Fujian (CN)

(72) Inventors: Cai Jin Ye, Xiamen (CN); Lien Hsin Lee, Taipei (TW); Tsai Kuei Wei, Hsinchu County (TW); Chih Cheng Chuang, Zhubei (TW); Ren Hung Wang, Taichung (TW); Sun Po Lin, Hsinchu County (TW); Wei Yi Lin, Taoyuan (TW); Tai Shih Cheng, Taipei (TW); Chu Chiang Lin, Taoyuan (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 17/005,205

(22) Filed: Aug. 27, 2020

(30) Foreign Application Priority Data

Jun. 18, 2020 (CN) .......................... 202010559086.7

(51) Int. Cl.
*G06F 3/041* (2006.01)
*H01L 27/32* (2006.01)

(52) U.S. Cl.
CPC .......... *G06F 3/0412* (2013.01); *H01L 27/323* (2013.01); *G06F 2203/04105* (2013.01)

(58) Field of Classification Search
None
See application file for complete search history.

(56) References Cited

U.S. PATENT DOCUMENTS

| | | | | |
|---|---|---|---|---|
| 2014/0313141 | A1* | 10/2014 | Park | G06F 1/1635 345/173 |
| 2017/0010704 | A1* | 1/2017 | Chen | G02F 1/133514 |
| 2017/0344165 | A1* | 11/2017 | Heo | G06F 3/04166 |
| 2018/0095580 | A1* | 4/2018 | Yi | G01L 1/205 |

* cited by examiner

*Primary Examiner* — Brian M Butcher
(74) *Attorney, Agent, or Firm* — Cooper Legal Group, LLC

(57) ABSTRACT

An electronic apparatus includes a flexible cover plate, a force sensing module, a touch display module, and a metal thin plate. The force sensing module includes a flexible electrode and a flexible force-sensitive composite layer. The flexible force-sensitive composite layer includes at least one flexible electrode layer and at least one functional spacer layer. The flexible electrode layer has a first resistivity. The functional spacer layer has a second resistivity greater than the first resistivity. The flexible electrode layer and the functional spacer layer are disposed under the flexible electrode. The touch display module is disposed between the flexible cover plate and the force sensing module and includes an organic light emitting display unit and a touch sensing layer. The metal thin plate is disposed under the force sensing module and serves as a contact electrode of the force sensing module.

11 Claims, 11 Drawing Sheets

153

ELECTRONIC APPARATUS

CROSS-REFERENCE TO RELATED APPLICATION

This application claims priority to China Application Serial Number 202010559086.7, filed Jun. 18, 2020, which is herein incorporated by reference.

BACKGROUND

Technical Field

The present disclosure relates to an electronic apparatus.

Description of Related Art

With the diversified development of touch modules, touch modules have been maturely applied to industrial electronics and consumer electronics products. Demand has progressed from determining the two-dimensional position (e.g., the X-axis direction and the Y-axis direction) of the touch point on the surface of the screen to also sensing the force parameter caused by the change of the force applied to the surface of the screen (e.g., the Z-axis direction). Even the application requirements for flexible panels will be inevitable.

However, the conventional technology proposed by the existing industry has the following problems in the pressure sensor mounted on the touch module: (1) the X-Y-Z three-axis electrodes cannot have flexible characteristics at the same time and cannot be used as a flexible assembly; and (2) only a partial area has the Z-axis sensing function.

Accordingly, how to provide an electronic apparatus to solve the aforementioned problems has become an important issue to be solved by those in the industry.

SUMMARY

An aspect of the disclosure is to provide an electronic apparatus that can efficiently solve the aforementioned problems.

According to an embodiment of the disclosure, an electronic apparatus includes a flexible cover plate, a force sensing module, a touch display module, and a metal thin plate. The force sensing module includes a flexible electrode and a flexible force-sensitive composite layer. The flexible force-sensitive composite layer includes at least one flexible electrode layer and at least one functional spacer layer. The flexible electrode layer has a first resistivity. The functional spacer layer has a second resistivity greater than the first resistivity. The flexible electrode layer and the functional spacer layer are disposed under the flexible electrode. The touch display module is disposed between the flexible cover plate and the force sensing module and includes an organic light emitting display unit and a touch sensing layer. The metal thin plate is disposed under the force sensing module and serves as a contact electrode of the force sensing module.

In an embodiment of the disclosure, the touch display module is an out-cell type touch display module or an on-cell type touch display module.

In an embodiment of the disclosure, the flexible electrode layer is a silver nanowire electrode layer.

In an embodiment of the disclosure, the functional spacer layer is a substrate layer doped with a low concentration of silver nanowires.

In an embodiment of the disclosure, the metal thin plate is a copper foil or a steel plate.

In an embodiment of the disclosure, the flexible electrode is disposed between the flexible force-sensitive composite layer and the touch display module.

In an embodiment of the disclosure, the electronic apparatus further includes a conductive adhesive. The conductive adhesive is disposed between the metal thin plate and the flexible force-sensitive composite layer.

In an embodiment of the disclosure, the electronic apparatus further includes a flexible carrier substrate. The flexible carrier substrate is disposed between the flexible electrode and the touch display module.

In an embodiment of the disclosure, the flexible electrode includes a plurality of electrode blocks. The electrode blocks are spaced apart from each other.

In an embodiment of the disclosure, the electronic apparatus further includes a polarizing element. The polarizing element is disposed between the flexible cover plate and the touch display module.

In an embodiment of the disclosure, a pressure signal of the flexible force-sensitive composite layer is extracted by a voltage divider circuit or a Wheatstone circuit.

Accordingly, in the electronic apparatus of the present disclosure, the force sensing module adopts the flexible force-sensitive composite layer with flexibility and good piezoresistive linearity (i.e., including silver nanowire electrode layers with a low resistivity and functional spacer layers with a high resistivity alternately stacked) and cooperates with the flexible cover plate and the touch display module including the organic light emitting display unit, so that a flexible three-dimensional touch sensing function can be realized. The disclosure further uses the metal thin plate normally used in conjunction with the organic light emitting display unit as one of the electrodes of the force sensing module. Therefore, the metal thin plate also has the following functions: (1) preventing the panel from scratching; (2) providing the effect of spreading and flattening; (3) anti-interference (preventing interference with the signal of the motherboard below); and (4) serving as the contact electrode of the force sensing module.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
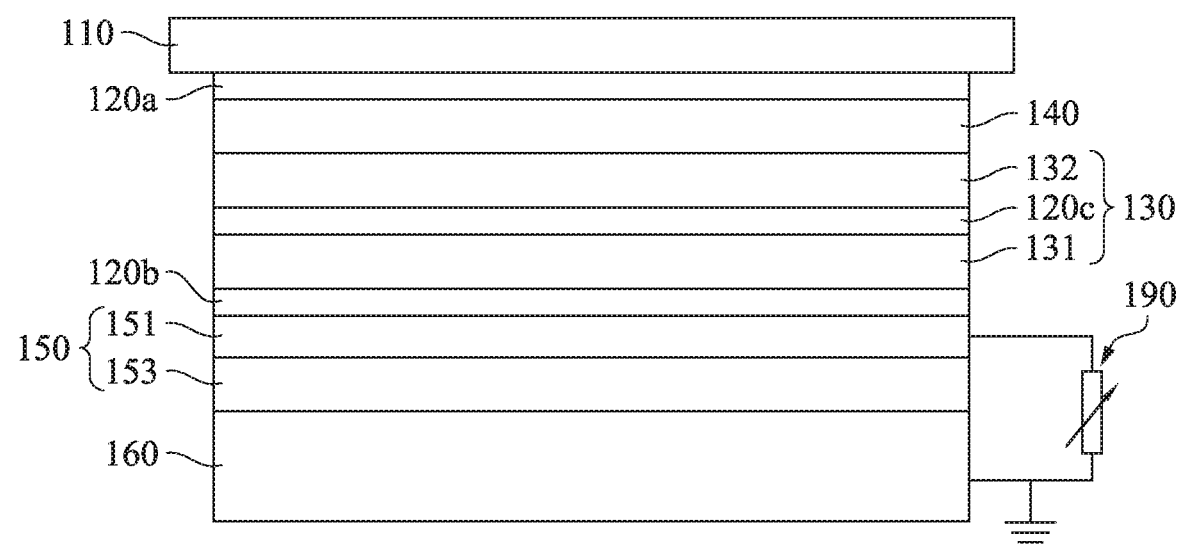
FIG. 1 is a schematic diagram of an electronic apparatus according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a schematic diagram of an electronic apparatus 100A according to an embodiment of the disclosure. As shown in FIG. 1, the electronic apparatus 100A of the present embodiment is a flexible touch display device as an example and includes a flexible cover plate 110, adhesive layers 120a, 120b, a touch display module 130, a polarizing element 140, a force sensing module 150, and a metal thin plate 160. The polarizing element 140 is disposed between the flexible cover plate 110 and the touch display module 130, in which the polarizing element 140 is adhered to the flexible cover plate 110 through the adhesive layer 120a, and the touch display module 130 is attached to a side of the polarizing element 140 away from the flexible cover plate 110. The touch display module 130 is disposed between the polarizing element 140 and the force sensing module 150, in which the force sensing module 150 is adhered to the touch display module 130 through the adhesive layer 120b.

In some embodiments, a material of the flexible cover plate 110 includes a flexible polymer material. For example, the flexible polymer material includes Colorless Polyimide (PI), but the present disclosure is not limited in this regard.

In some embodiments, as shown in FIG. 1, the touch display module 130 includes an organic light emitting display unit 131, a touch sensing layer 132, and an adhesive layer 120c. The adhesive layer 120c is adhered between the organic light emitting display unit 131 and the touch sensing layer 132. The organic light emitting display unit 131 is adhered to the force sensing module 150 through the adhesive layer 120c. The touch display module 130 is attached to the side of the polarizing element 140 away from the flexible cover plate 110 by the touch sensing layer 132. The touch sensing layer 132 is configured to sense the two-dimensional position (for example, in X-axis direction and Y-axis direction) of a user's touch point on the flexible cover plate 110 of the electronic apparatus 100A.

In some embodiments, as shown in FIG. 1, the force sensing module 150 includes a flexible electrode 151 and a flexible force-sensitive composite layer 153. The flexible force-sensitive composite layer 153 is stacked under the flexible electrode 151. The flexible electrode 151 is disposed between the flexible force-sensitive composite layer 153 and the touch display module 130 and is adhered to the organic light emitting display unit 131 of the touch display module 130 through the adhesive layer 120b. The force sensing module 150 is configured to sense the force parameter caused by the change of force applied by the user on the surface of the flexible cover plate 110 (i.e., in Z-axis direction) of the electronic apparatus 100A. In addition, the metal thin plate 160 is disposed under the force sensing module 150. The force sensing module 150 is manufactured on the metal thin plate 160 by a coating process. The metal thin plate 160 serves as a contact electrode of the force sensing module 150.

Figure 2:
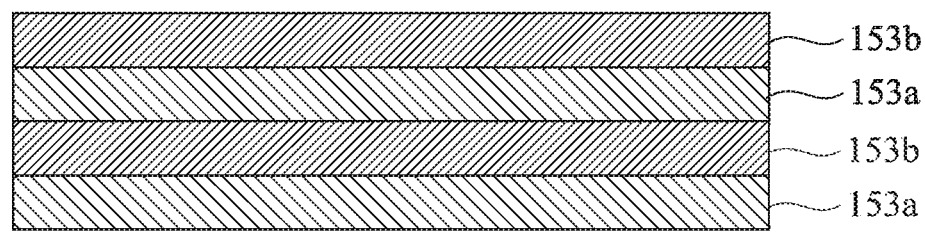
FIG. 2 is a schematic diagram of a flexible force-sensitive composite layer according to an embodiment of the disclosure.

Reference is made to FIG. 2. FIG. 2 is a schematic diagram of the flexible force-sensitive composite layer 153 according to an embodiment of the disclosure. As shown in FIG. 2, the flexible force-sensitive composite layer 153 includes at least one flexible electrode layer 153a and at least one functional spacer layer 153b. The flexible electrode layer 153a has a first resistivity. The functional spacer layer 153b has a second resistivity greater than the first resistivity. The flexible electrode layer 153a and the functional spacer layer 153b are laminated under the flexible electrode 151.

Figure 3A:
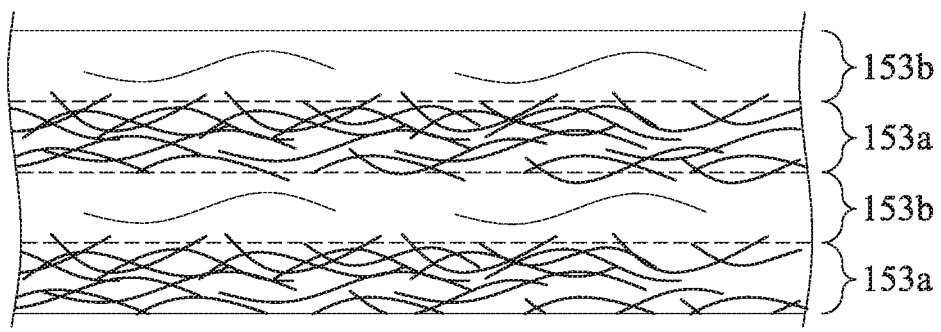
FIG. 3A is a partial enlarged view of the flexible force-sensitive composite layer in FIG. 2 that is not pressed.

In some embodiments, the second resistivity is about 3 to about 50 times the first resistivity, but the present disclosure is not limited in this regard. In order to make the flexible force-sensitive composite layer 153 meet the requirements of flexibility, in some embodiments, the flexible electrode layer 153a in the flexible force-sensitive composite layer 153 is a silver nanowire (SNW; also known as AgNW) electrode layer. Reference is made to FIG. 3A. FIG. 3A is a partial enlarged view of the flexible force-sensitive composite layer 153 in FIG. 2 that is not pressed. As shown in FIG. 3A, the flexible electrode layer 153a includes a substrate and silver nanowires doped therein. The silver nanowires overlap each other in the substrate to form a conductive network. The substrate refers to a non-nanosilver material remaining on the flexible electrode 151. The non-nanosilver material is formed by coating a solution including a volatile material and silver nanowires on the flexible electrode 151 and then heating and drying to volatilize the volatile material. The silver nanowires are distributed or embedded in the substrate and partially protrude out from the substrate. The substrate can protect the silver nanowires from the external environment, such as protecting the silver nanowires from corrosion and abrasion. In some embodiments, the substrate is compressible.

In some embodiments, a wire length of the silver nanowires ranges from about 10 μm to about 300 μm. In some embodiments, a wire diameter (or a wire width) of the silver nanowires is less than about 500 nm. In some embodiments, an aspect ratio (i.e., a ratio of the wire length to the wire diameter) of the silver nanowires is greater than 10. In some embodiments, the silver nanowires can be deformed forms such as other conductive metal nanowires or non-conductive nanowires coated with silver. The use of the silver nanowires to form the silver nanowire electrode layers has the following advantages: low price compared with ITO, simple process, good flexibility, resistance to bending, and etc.

In order to make the flexible force-sensitive composite layer 153 meet the requirements of flexibility, the functional spacer layer 153b in the flexible force-sensitive composite layer 153 may be a flexible coating formed on the flexible electrode layer 153a. In some embodiments, as shown in FIG. 3A, the functional spacer layer 153b is a substrate layer doped with a low concentration of silver nanowires. Specifically, the functional spacer layer 153b includes a substrate layer and a low concentration of silver nanowires doped therein, so that the second resistivity of the functional spacer layer 153b is greater than the first resistivity of the flexible electrode layer 153a. In some embodiments, the substrate of the functional spacer layer 153b is identical to the substrate of the flexible electrode layer 153a, but the present disclosure is not limited in this regard.

Figure 3B:
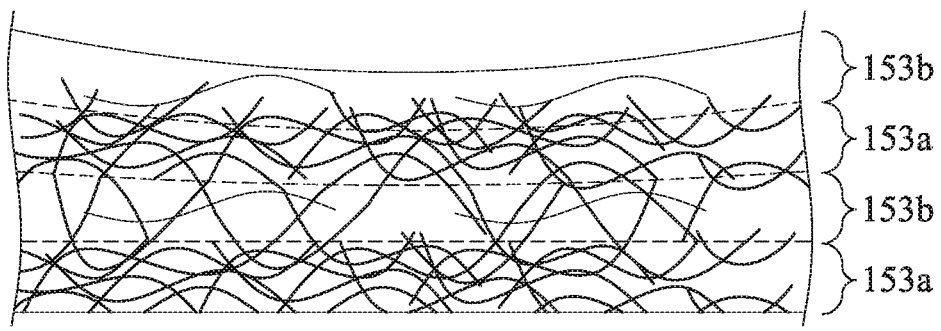
FIG. 3B is a partial enlarged view of the flexible force-sensitive composite layer in FIG. 2 that is pressed.

Reference is made to FIG. 3B. FIG. 3B is a partial enlarged view of the flexible force-sensitive composite layer 153 in FIG. 2 that is pressed. As shown in FIGS. 3A and 3B, since the flexible electrode layer 153a is made of silver nanowires, when an external pressing force from the side of the flexible cover plate 110 is transmitted to the force sensing module 150, the flexible electrode layer 153a will be compressed by the force to cause the silver nanowires inside to approach and pass through the functional spacer layer 153b. When the number of contacting points increases, the overall conductivity of the flexible force-sensitive composite layer 153 is improved (i.e., the resistivity decreases). Therefore, after the change in the resistivity is detected by the electrical signal between the flexible electrode 151 and the metal thin plate 160, a pressure sensing chip can calculate the value of the external pressing force. For example, if the external pressing force is large, the resistivity of the flexible force-sensitive composite layer 153 has a greater amount of change; on the contrary, if the external pressing force is small, the resistivity of the flexible force-sensitive composite layer 153 has a small amount of change. Therefore, the value of the external pressing force can be calculated by the change in resistivity of the flexible force-sensitive composite layer 153.

In some embodiments, the resistivity of the flexible electrode layer 153a ranges from about 1 Ops (Ohm per Square) to about 150 Ops (preferably 60 Ops), and a thickness of the flexible electrode layer 153a ranges from about 1 nm to about 200 nm (preferably from about 40 nm to about 80 nm). In some embodiments, a thickness of the functional spacer layer 153b ranges from about 40 nm to about 1500 nm (preferably from about 60 nm to about 100 nm).

As shown in FIG. 2, in the present embodiment, the flexible force-sensitive composite layer 153 includes two flexible electrode layers 153a and two functional spacer layers 153b. The flexible electrode layers 153a and the functional spacer layers 153b are alternately stacked. However, the lamination form of the flexible electrode layers 153a and the functional spacer layers 153b is not limited to what is illustrated in FIG. 2.

In some other embodiments, if only to enable the force sensing module 150 to achieve its basic functions, the flexible force-sensitive composite layer 153 may also only include one flexible electrode layer 153a and one functional spacer layer 153b.

In some embodiments, the flexible electrode 151 can be an ITO electrode layer or an electrode layer including silver nanowires, but the present disclosure is not limited in this regard.

With the foregoing structural configurations, since the force sensing module 150 adopts the flexible force-sensitive composite layer 153 with flexibility and good piezoresistive linearity (i.e., including the silver nanowire electrode layers with a low resistivity and the functional spacer layers 153b with a high resistivity alternately stacked) and cooperates with the flexible cover plate 110 and the touch display module 130 including the organic light emitting display unit 131, the electronic apparatus 100A can realize a flexible three-dimensional touch sensing function. In addition, by using the metal thin plate 160 normally used in conjunction with the organic light emitting display unit 131 as one of the electrodes of the force sensing module 150, the metal thin plate also has the following functions: (1) preventing the panel from scratching; (2) providing the effect of spreading and flattening; (3) anti-interference (preventing interference with the signal of the motherboard below); and (4) serving as the contact electrode of the force sensing module 150.

In some embodiments, at least one of the adhesive layers 120a, 120b, 120c is an optical clear adhesive (OCA), but the present disclosure is not limited in this regard, and liquid OCA (LOCA) or pressure-sensitive adhesive (PSA) can also be selected.

In some embodiments, the metal thin plate 160 is a copper foil or a steel plate, but the present disclosure is not limited in this regard.

Figure 4:
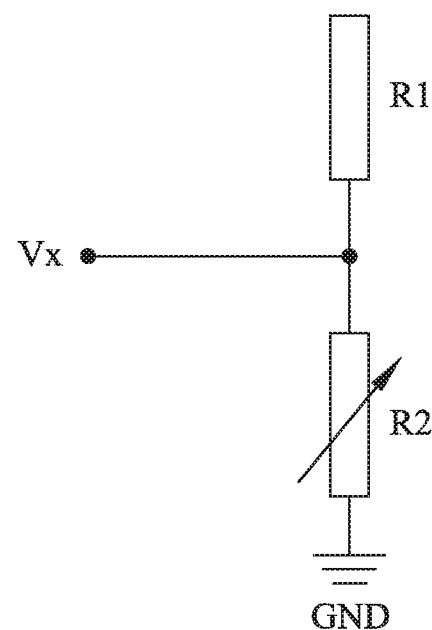
FIG. 4 is a schematic diagram showing a circuit for extracting the pressure signal sensed by the flexible force-sensitive composite layer.

Reference is made to FIG. 4. FIG. 4 is a schematic diagram showing a circuit 190 for extracting the pressure signal sensed by the flexible force-sensitive composite layer 153. As shown in FIGS. 1 and 4, in some embodiments, in order to extract the pressure signal sensed by the flexible force-sensitive composite layer 153, an adjustable resistor R2 of the flexible force-sensitive composite layer 153 can be connected to a voltage divider circuit including a peripheral resistor R1, and the pressure signal can be extracted by detecting the change of voltage (Vx) value, so that the pressure can be determined according to the pressure signal.

Figure 5:
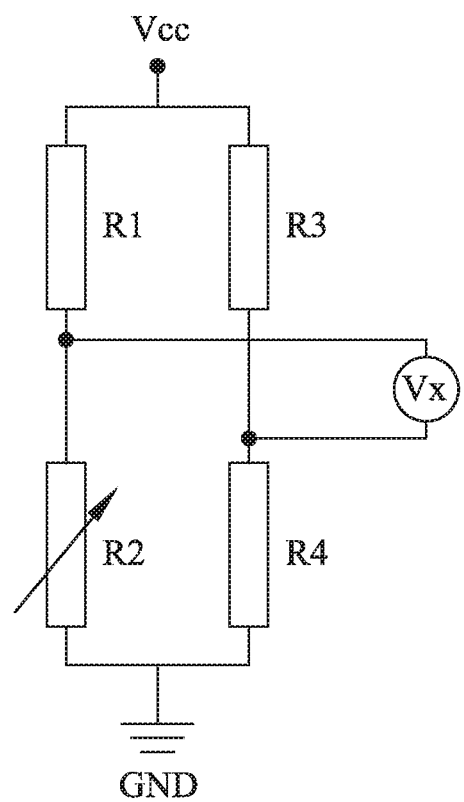
FIG. 5 is a schematic diagram showing a circuit for extracting the pressure signal sensed by the flexible force-sensitive composite layer.

Reference is made to FIG. 5. FIG. 5 is a schematic diagram showing a circuit 190A for extracting the pressure signal sensed by the flexible force-sensitive composite layer 153. As shown in FIGS. 1 and 5, in some embodiments, in order to extract the pressure signal sensed by the flexible force-sensitive composite layer 153, the adjustable resistor R2 of the flexible force-sensitive composite layer 153 can also be connected to a Wheatstone circuit including peripheral resistors R1, R3, R4, and the pressure signal can be extracted by detecting the change of voltage (Vx) value, so that the pressure can be determined according to the pressure signal.

Figure 6:
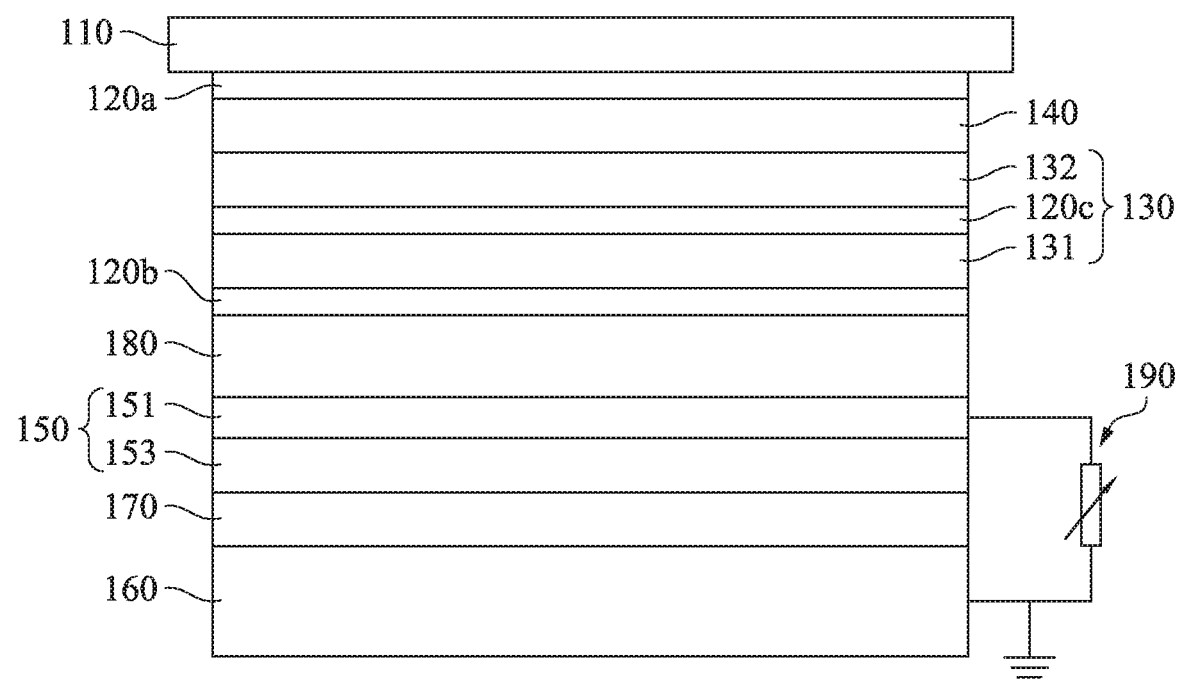
FIG. 6 is a schematic diagram of an electronic apparatus according to an embodiment of the disclosure.

It should be pointed out that in some embodiments as shown in FIG. 1, the force sensing module 150 is directly manufactured on the metal thin plate 160 by a coating process, but the present disclosure is not limited in this regard. Reference is made to FIG. 6. FIG. 6 is a schematic diagram of an electronic apparatus 100B according to an embodiment of the disclosure.

As shown in FIG. 6, the electronic apparatus 100B also includes the flexible cover plate 110, the adhesive layers 120a, 120b, the touch display module 130, the polarizing element 140, the force sensing module 150, and the metal thin plate 160. Therefore, descriptions of the relative positions and functions of these components can be referenced above and will not be repeated here. Compared with the embodiment shown in FIG. 1, the electronic apparatus 100B of the present embodiment further includes a conductive adhesive 170 and a flexible carrier substrate 180. The flexible carrier substrate 180 is disposed between the flexible electrode 151 and the touch display module 130. The conductive adhesive 170 is disposed between the metal thin plate 160 and the flexible force-sensitive composite layer 153.

In detail, when manufacturing the electronic apparatus 100B, the force sensing module 150 can be first manufactured on the flexible carrier substrate 180 by a coating process, and then the force sensing module 150 is adhered to the metal thin plate 160 through the conductive adhesive 170. It can be seen that, by using the conductive adhesive 170 and the flexible carrier substrate 180, the electronic apparatus 100B of the present embodiment can increase the flexibility of the manufacturing processes.

In some embodiments, a material of the flexible carrier substrate 180 includes Polyethylene terephthalate (PET), PI, or Cyclo Olefin Polymer (COP), but the present disclosure is not limited in this regard.

Figure 7:
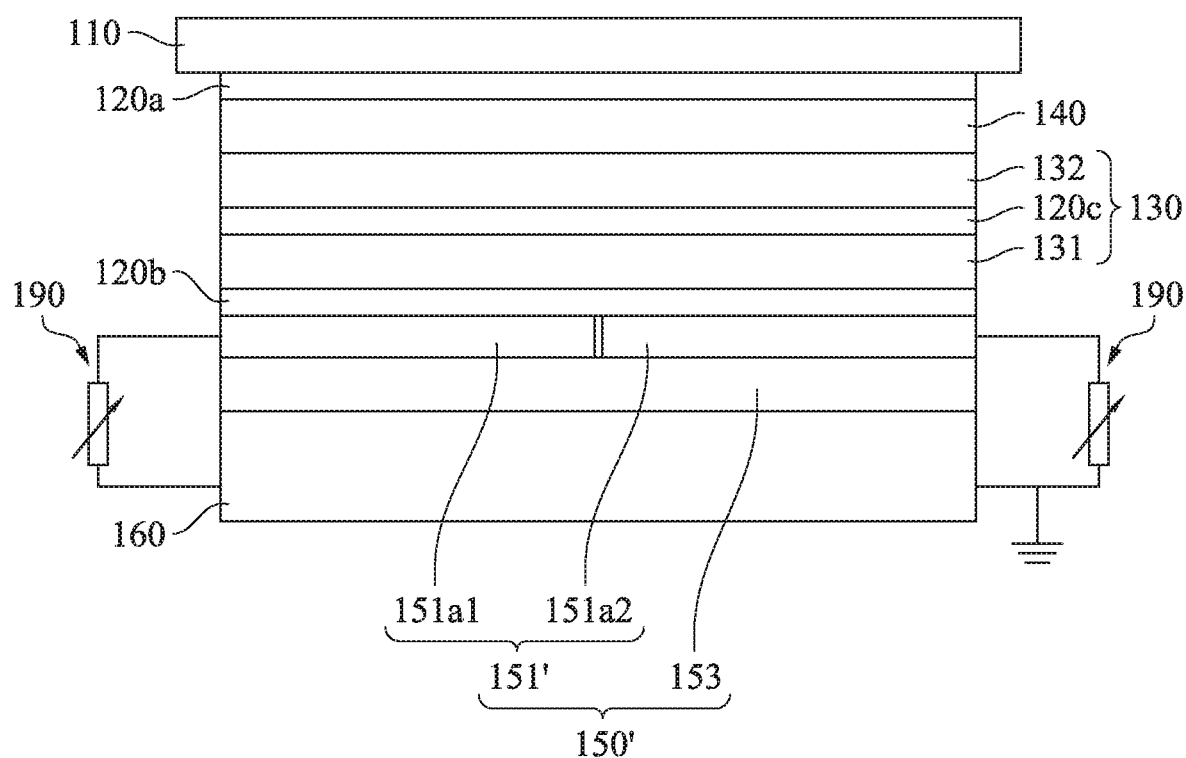
FIG. 7 is a schematic diagram of an electronic apparatus according to an embodiment of the disclosure.

It should be noted that, in some embodiments, as shown in FIG. 1, the flexible electrode 151 of the force sensing module 150 is a one-piece structure and can provide a single-finger detection function, but the present disclosure is not limited in this regard. Reference is made to FIG. 7. FIG. 7 is a schematic diagram of an electronic apparatus 100C according to an embodiment of the disclosure.

As shown in FIG. 7, the electronic apparatus 100C also includes the flexible cover plate 110, the adhesive layers 120a, 120b, the touch display module 130, the polarizing element 140, and the metal thin plate 160. Therefore, descriptions of the relative positions and functions of these components can be referenced above and will not be repeated here.

Compared with the embodiment shown in FIG. 1, the electronic apparatus 100C of the present embodiment is modified for the force sensing module 150.

Specifically, the flexible electrode 151' of the force sensing module 150' includes a plurality of electrode blocks 151a1, 151a2. The electrode blocks 151a1, 151a2 are spaced apart from each other. During manufacturing, the flexible electrode 151 shown in FIG. 1 can be patterned to obtain the flexible electrode 151' including the plurality of electrode blocks 151a1, 151a2 in FIG. 7. With the electrode blocks 151a1, 151a2 spaced apart from each other, the force sensing module 150' can achieve multi-finger detection.

Figure 8:
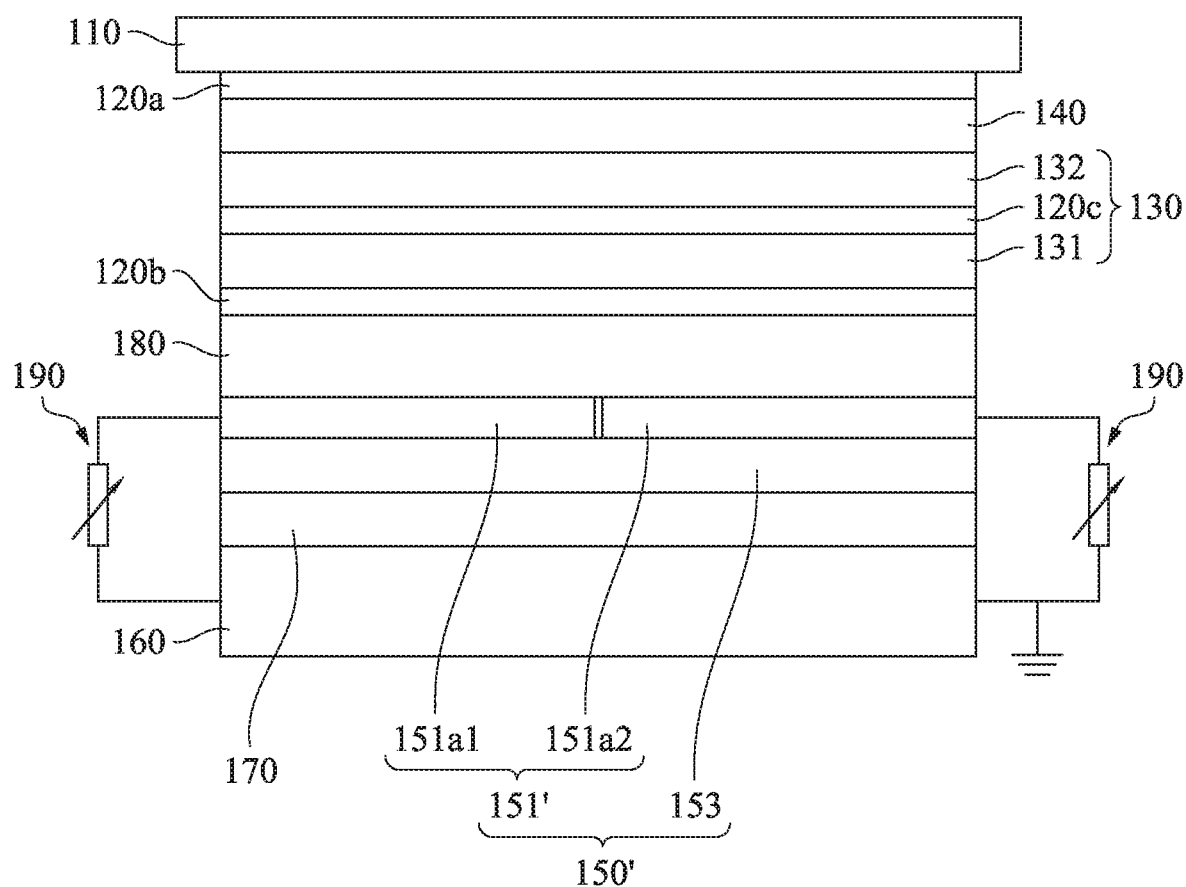
FIG. 8 is a schematic diagram of an electronic apparatus according to an embodiment of the disclosure.

Reference is made to FIG. 8. FIG. 8 is a schematic diagram of an electronic apparatus 100D according to an embodiment of the disclosure. As shown in FIG. 8, the electronic apparatus 100D also includes the flexible cover plate 110, the adhesive layers 120a, 120b, the touch display module 130, the polarizing element 140, the force sensing module 150', and the metal thin plate 160. Therefore, descriptions of the relative positions and functions of these components can be referenced above and will not be repeated here.

Compared with the embodiment shown in FIG. 7, the electronic apparatus 100D of the present embodiment further includes the conductive adhesive 170 and the flexible carrier substrate 180. The flexible carrier substrate 180 is disposed between the flexible electrode 151' and the touch display module 130. The conductive adhesive 170 is disposed between the metal thin plate 160 and the flexible force-sensitive composite layer 153.

In detail, when manufacturing the electronic apparatus 100D, the force sensing module 150' can be first manufactured on the flexible carrier substrate 180 by a coating process, and then the force sensing module 150' is adhered to the metal thin plate 160 through the conductive adhesive 170. It can be seen that, by using the conductive adhesive 170 and the flexible carrier substrate 180, the electronic apparatus 100D of the present embodiment can increase the flexibility of the manufacturing processes.

It should be noted that, in some embodiments, as shown in FIGS. 1 and 6 to 8, the touch display module 130 is an out-cell type touch display module, but the present disclosure is not limited in this regard.

Figure 9:
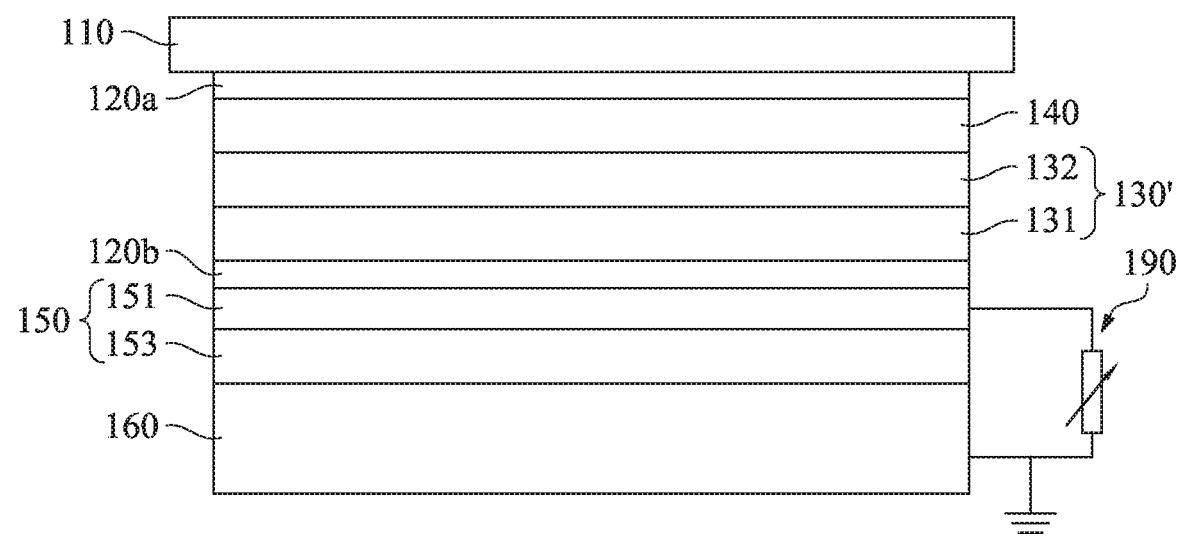
FIG. 9 is a schematic diagram of an electronic apparatus according to an embodiment of the disclosure.
Figure 10:
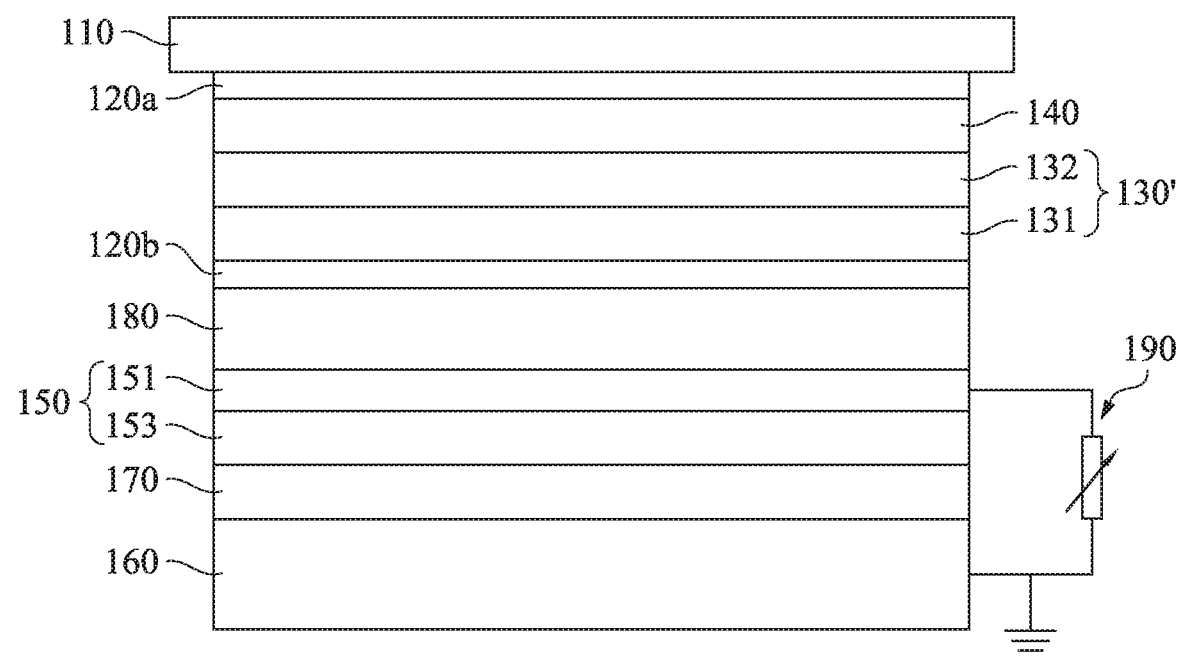
FIG. 10 is a schematic diagram of an electronic apparatus according to an embodiment of the disclosure.
Figure 11:
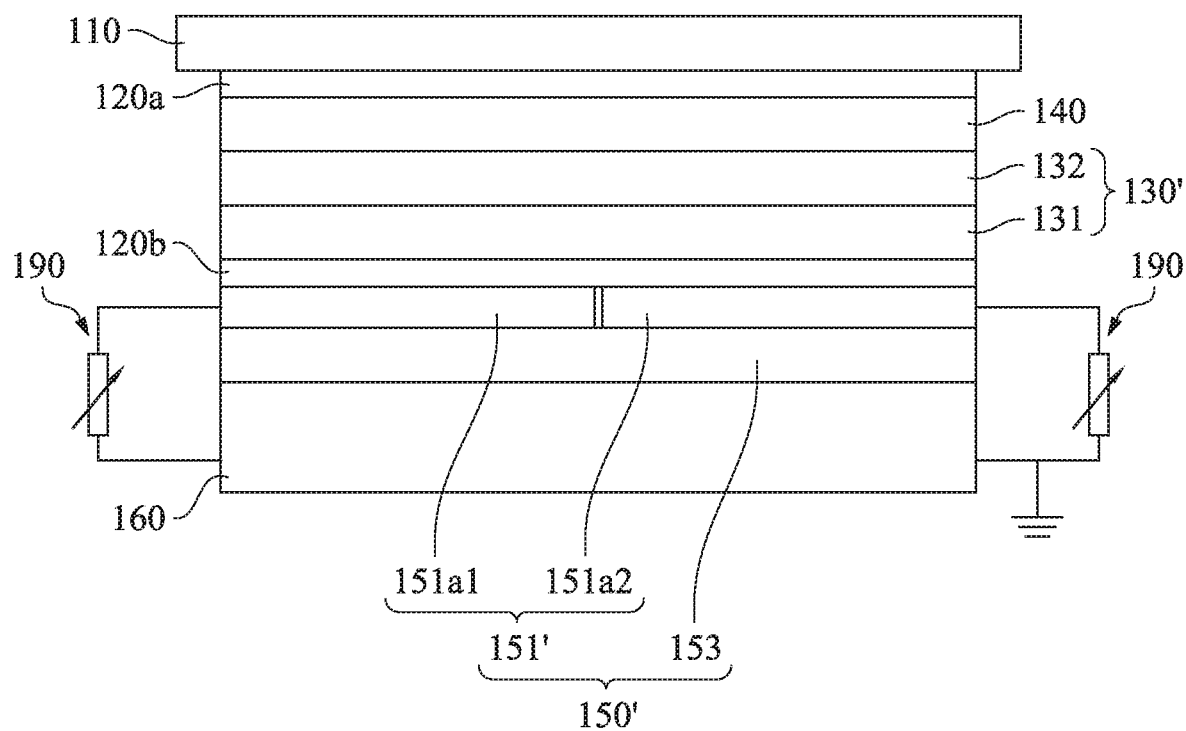
FIG. 11 is a schematic diagram of an electronic apparatus according to an embodiment of the disclosure.
Figure 12:
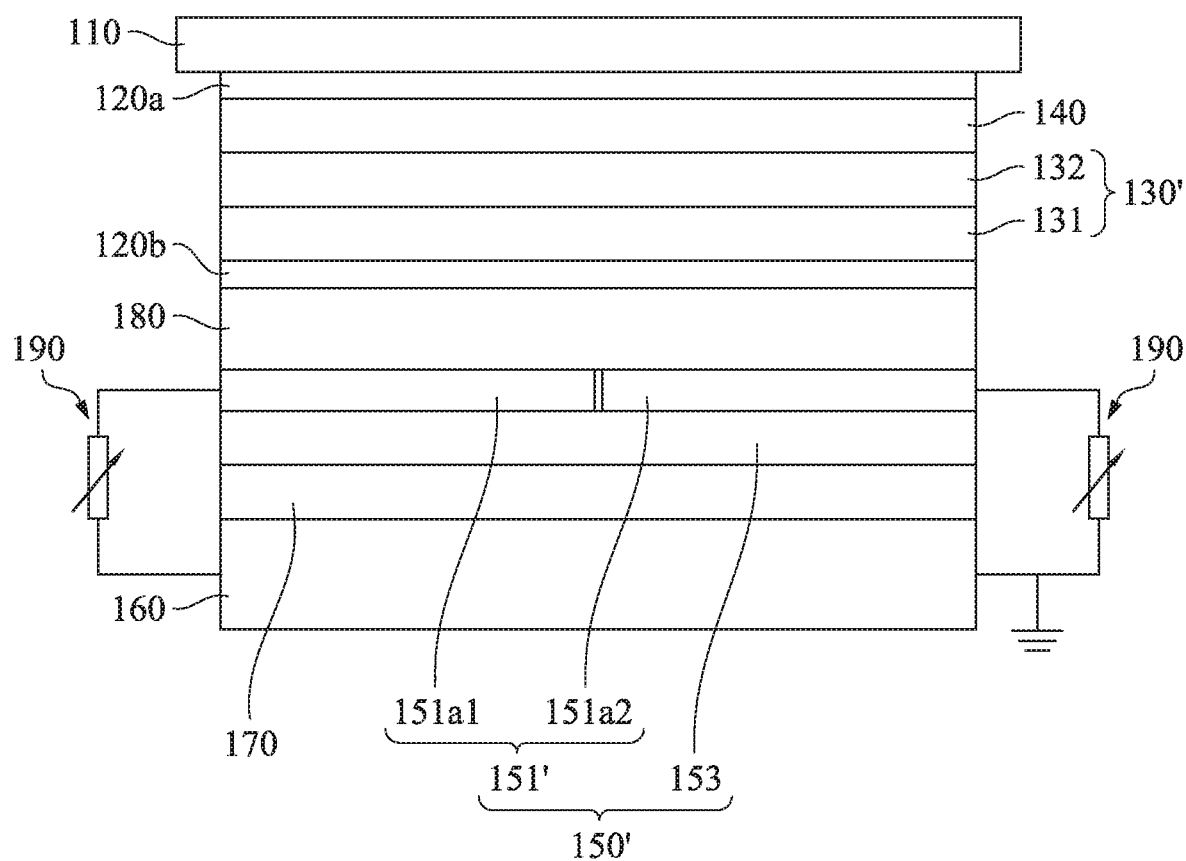
FIG. 12 is a schematic diagram of an electronic apparatus according to an embodiment of the disclosure.

Reference is made to FIGS. 9 to 12. FIG. 9 is a schematic diagram of an electronic apparatus 100E according to an embodiment of the disclosure. FIG. 10 is a schematic diagram of an electronic apparatus 100F according to an embodiment of the disclosure. FIG. 11 is a schematic diagram of an electronic apparatus 100G according to an embodiment of the disclosure. FIG. 12 is a schematic diagram of an electronic apparatus 100H according to an embodiment of the disclosure. The electronic apparatuses 100E, 100F, 100G, 100H shown in FIGS. 9 to 12 are modified based on the electronic apparatuses 100A, 100B, 100C, 100D shown in FIGS. 1 and 6 to 8, respectively.

Specifically, the electronic apparatuses 100E, 100F, 100G, 100H shown in FIGS. 9 to 12 are respectively obtained by replacing the out-cell type touch display module 130 in FIGS. 1 and 6 to 8 with an on-cell type touch display module 130'. Compared with the out-cell type touch display module 130, the on-cell type touch display module 130' eliminates the adhesive layer 120c. That is, in the on-cell type touch display module 130', the touch sensing layer 132 is directly manufactured on the organic light emitting display unit 131 by a coating process.

According to the foregoing recitations of the embodiments of the disclosure, it can be seen that in the electronic apparatus of the present disclosure, the force sensing module adopts the flexible force-sensitive composite layer with flexibility and good piezoresistive linearity (i.e., including silver nanowire electrode layers with a low resistivity and functional spacer layers with a high resistivity alternately stacked) and cooperates with the flexible cover plate and the touch display module including the organic light emitting display unit, so that a flexible three-dimensional touch sensing function can be realized. The disclosure further uses the metal thin plate normally used in conjunction with the organic light emitting display unit as one of the electrodes of the force sensing module. Therefore, the metal thin plate also has the following functions: (1) preventing the panel from scratching; (2) providing the effect of spreading and flattening; (3) anti-interference (preventing interference with the signal of the motherboard below); and (4) serving as the contact electrode of the force sensing module.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic apparatus, comprising:
    a flexible cover plate;
    a force sensing module comprising:
        a flexible electrode; and
        a flexible force-sensitive composite layer comprising:
            at least one flexible electrode layer having a first resistivity; and at least one functional spacer layer having a second resistivity greater than the first resistivity, wherein the at least one flexible electrode layer and the at least one functional spacer layer are disposed under the flexible electrode;

a touch display module disposed between the flexible cover plate and the force sensing module and comprising an organic light emitting display unit and a touch sensing layer; and a metal thin plate disposed under the force sensing module and serving as a contact electrode of the force sensing module.

2. The electronic apparatus of claim 1, wherein the touch display module is an out-cell type touch display module or an on-cell type touch display module.

3. The electronic apparatus of claim 1, wherein the at least one flexible electrode layer is a silver nanowire electrode layer.

4. The electronic apparatus of claim 1, wherein the at least one functional spacer layer is a substrate layer doped with a low concentration of silver nanowires.

5. The electronic apparatus of claim 1, wherein the metal thin plate is a copper foil or a steel plate.

6. The electronic apparatus of claim 1, wherein the flexible electrode is disposed between the flexible force-sensitive composite layer and the touch display module.

7. The electronic apparatus of claim 6, further comprising a conductive adhesive disposed between the metal thin plate and the flexible force-sensitive composite layer.

8. The electronic apparatus of claim 6, further comprising a flexible carrier substrate disposed between the flexible electrode and the touch display module.

9. The electronic apparatus of claim 6, wherein the flexible electrode comprises a plurality of electrode blocks spaced apart from each other.

10. The electronic apparatus of claim 1, further comprising a polarizing element disposed between the flexible cover plate and the touch display module.

11. The electronic apparatus of claim 1, wherein a pressure signal of the flexible force-sensitive composite layer is extracted by a voltage divider circuit or a Wheatstone circuit.

* * * * *